(12) United States Patent
Howard et al.

(10) Patent No.: US 11,674,979 B2
(45) Date of Patent: Jun. 13, 2023

(54) PROBE ASSEMBLY WITH TWO SPACED PROBES FOR HIGH FREQUENCY CIRCUIT BOARD TEST APPARATUS

(71) Applicant: HUNTRON, INC, Mill Creek, WA (US)

(72) Inventors: Alan Howard, Everett, WA (US); Bradley D. Grams, New Prague, MN (US)

(73) Assignee: Huntron, Inc., Mill Creek, WA (US)

( * ) Notice: Subject to any disclaimer, the term of this patent is extended or adjusted under 35 U.S.C. 154(b) by 0 days.

(21) Appl. No.: 17/504,825

(22) Filed: Oct. 19, 2021

(65) Prior Publication Data

US 2023/0120201 A1    Apr. 20, 2023

(51) Int. Cl.
| | | |
|---|---|---|
| *G01R 31/00* | (2006.01) | |
| *G01R 31/28* | (2006.01) | |
| *G01R 1/02* | (2006.01) | |
| *G01R 1/04* | (2006.01) | |
| *G01R 1/067* | (2006.01) | |
| *G01R 1/073* | (2006.01) | |
| *G01R 1/20* | (2006.01) | |

(52) U.S. Cl.
CPC ..... *G01R 1/07328* (2013.01); *G01R 1/06705* (2013.01); *G01R 31/2886* (2013.01)

(58) Field of Classification Search
CPC ........ G01R 31/00; G01R 31/01; G01R 31/02; G01R 31/28; G01R 31/2886; G01R 1/04; G01R 1/067; G01R 1/073; G01R 1/02; G01R 1/20

See application file for complete search history.

(56) References Cited

U.S. PATENT DOCUMENTS

| | | | |
|---|---|---|---|
| 7,091,730 B1* | 8/2006 | Parshotam | G01R 1/06705 324/763.01 |
| 2008/0177486 A1* | 7/2008 | Farkas | G01R 31/304 702/59 |

* cited by examiner

*Primary Examiner* — Neel D Shah
(74) *Attorney, Agent, or Firm* — Clark A. Puntigam; Jensen & Puntigam P.S.

(57) ABSTRACT

The probe assembly operates with a circuit board test apparatus and includes a main test probe and a secondary test probes. The probe assembly is capable of moving in X, Y and Z directions relative to a circuit board being tested (UUT). The two test probes are movable linearly relative to each other and rotatable together so as to accurately locate the two probes on selected pins on the UUT, for receiving signals from the selected pins, The received signals are transmitted to a display apparatus.

6 Claims, 6 Drawing Sheets

PROBE ASSEMBLY WITH TWO SPACED PROBES FOR HIGH FREQUENCY CIRCUIT BOARD TEST APPARATUS

TECHNICAL FIELD

This invention relates generally to probe assemblies for use with circuit board test apparatus, and more particularly concerns such an apparatus which includes two spaced probes.

BACKGROUND OF THE INVENTION

A typical probe assembly operates electromechanically under software control to test a plurality of predetermined points on a printed circuit board to determine possible faults. The printed circuit board to be tested is mounted in a test apparatus in a fixed position and the probe assembly is moved to selected pins on the board. The probe assembly in operation supplies a test signal to the selected circuit pins and then receives a return signal from the circuit pins. The received signals are applied to test equipment for determination of possible faults. Such test apparatus is generally known, such as shown in U.S. Pat. No. 7,091,730 which is owned by the owner of the present invention. In that arrangement, two probes are adjustable, typically mechanically, to allow for different spacings and orientations of the two probes. However, that test apparatus, as well as other similar test apparatus using probe assemblies, have difficulty testing high frequency circuits. The present probe assembly for use with a conventional test apparatus is designed specifically to accurately test high frequency circuits.

SUMMARY OF THE INVENTION

Accordingly, the present invention is a probe assembly for use with a circuit board test apparatus that is capable of holding a unit under test (UUT), comprising: a two pin probe portion having two spaced test probe mounting block assemblies; first and second test probes mounted respectively in the mounting block assemblies, wherein the probe mounting block assemblies and the first and second test probes are moveable in a controlled fashion toward and away from each other; motor encoder assemblies for moving the probe assembly in the X and Y directions, respectively, relative to the printed circuit board, for rotating the two pin probe portion with the test probes and for moving the test probes toward and away from each other; a motor encoder assembly for moving the probe assembly in the Z direction relative to the printed circuit board; a camera for selecting first and second pin locations on the UUT, for the test probes; a control assembly for calculating the distance between the selected first and second pin locations and for controlling the movement of the first and second test probes to the selected pin locations on the UUT; wherein signals from the pin locations on the UUT are received by the test probes in contact therewith; and a connection line for transmitting received signals from the selected pins to a test instrument for display of the received signals.

BEST MODE FOR CARRYING OUT THE INVENTION

Figure 1:
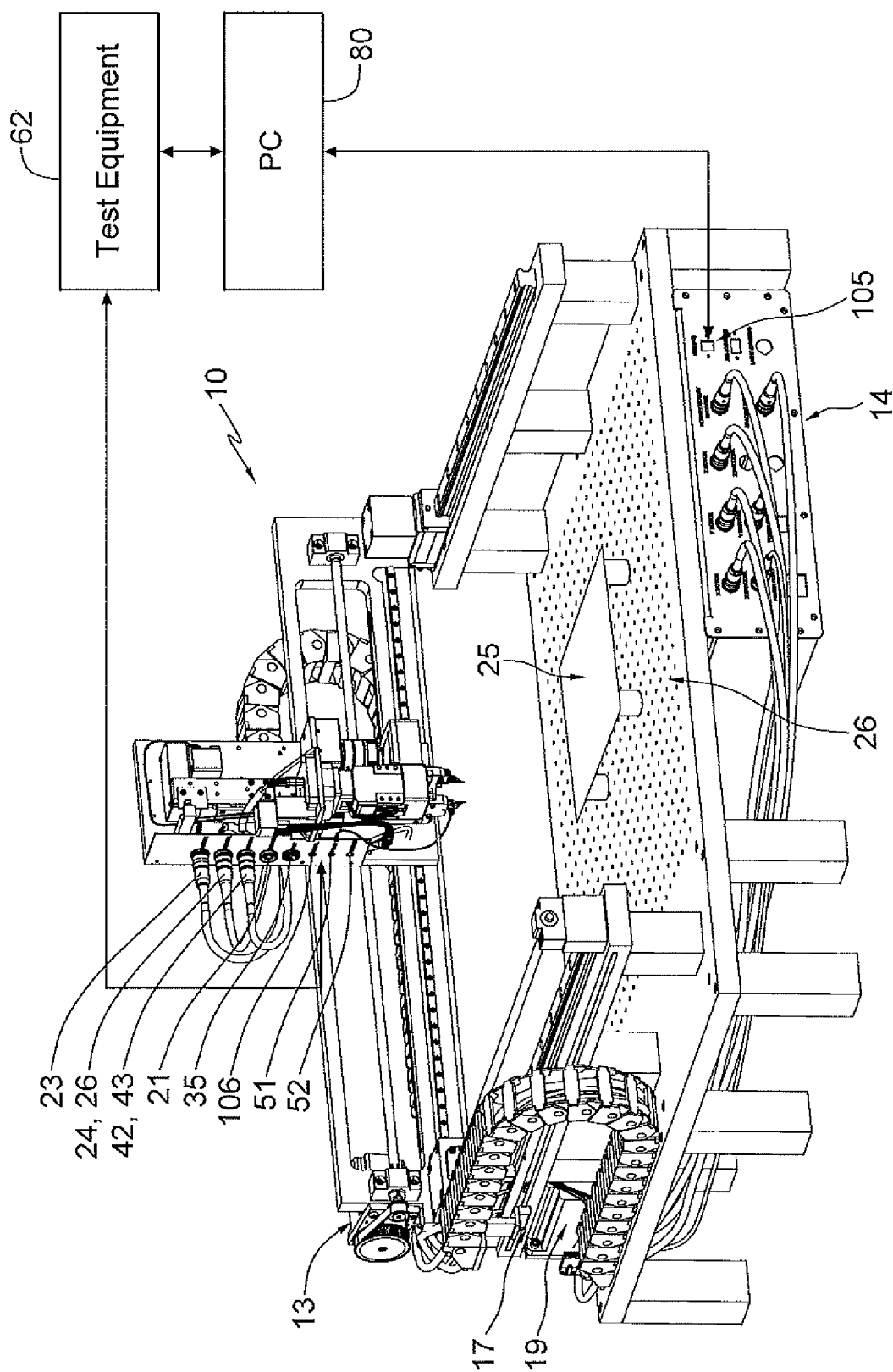
FIG. 1 is a perspective view of a circuit board tester with the probe assembly shown and described herein.
Figure 2:
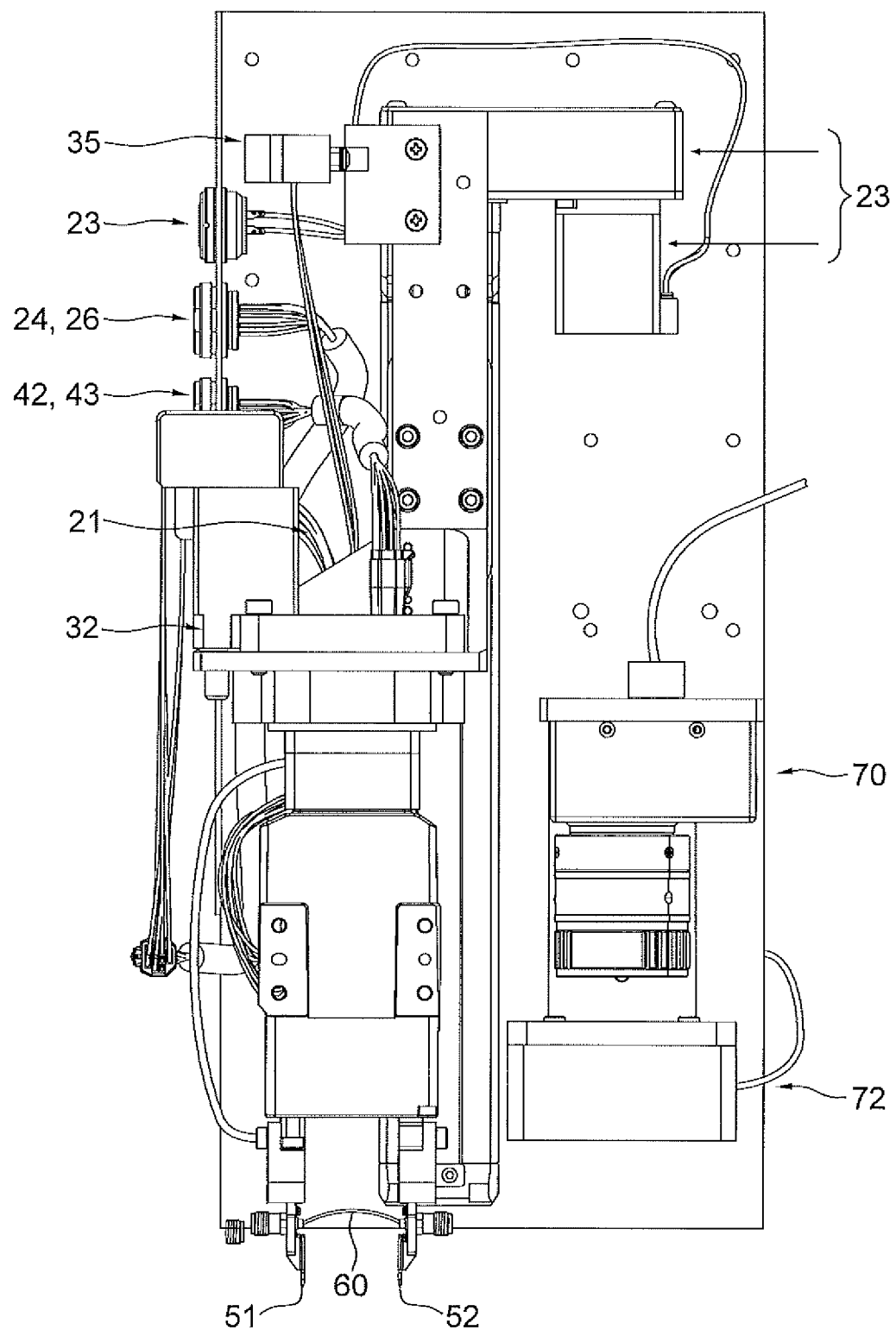
FIG. 2 is an elevational view of the probe assembly of the present invention.

FIG. 1 is a perspective view showing a printed circuit board test apparatus 10, which generally includes as an encoder shown at 11 and motor 13 with associated driver 14 (FIG. 6) for moving a probe assembly 15 in the X direction, laterally (across) the test apparatus of FIG. 1. FIG. 1 also shows an encoder generally at 17 and motor 19 with associated driver 20 (FIG. 6) for moving probe assembly 15 in the Y direction, longitudinally of the test apparatus of FIG. 1, perpendicular to the X direction. FIG. 2 shows an encoder 21 and linear actuator with motor 23 with associated driver 25, for moving the probe assembly 15 in the Z direction, toward and away from the electronics chassis 14 and the unit under test (UUT) 25, which is shown mounted in the test apparatus. A controller 27 is positioned in the electronics chassis 14, beneath the test apparatus platform 26. It controls the operation/movement of the probe assembly 15 in the X, Y and Z directions. Controller 27 is conventional and can be accomplished by various arrangements. Controller 27 operates with power supply 28 and a power switch 30 from line power (FIG. 6).

Figure 6:
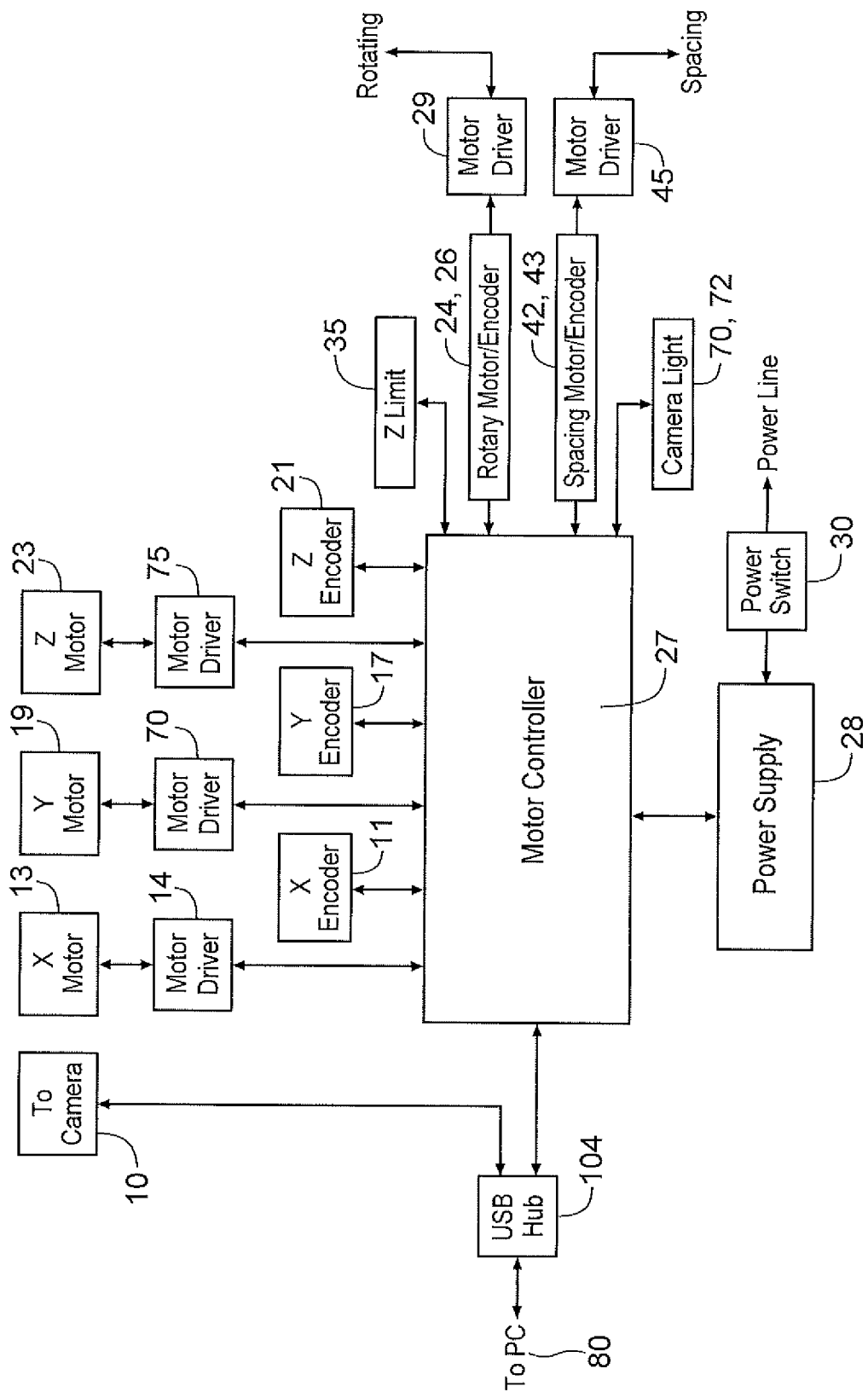
FIG. 6 is a chassis block diagram of the electronic chassis of FIG. 1.

FIG. 6 shows a general connection between the personal computer (PC) 80 and a USB hub 104 on the electronic chassis 14. A connection 105 is on the front of the test apparatus from the PC to the USB hub 104. Connections are made from the USB hub to the control assembly 27 (FIG. 6) which provides control signals for movement of the probe assembly in the X, Y and Z directions, each with its own encoder and motor and associated drive, as explained above. The Z direction includes a limit switch 35, which returns the probe assembly to its Z direction home position. Referring to FIGS. 1 and 2, motor 23 and motor driver 25 for Z direction, encoder 21 for Z direction and limit switch 35 for Z direction connection are shown, as well as a "signal" connection 106 when the apparatus is used as a single pin prober.

Figure 3:
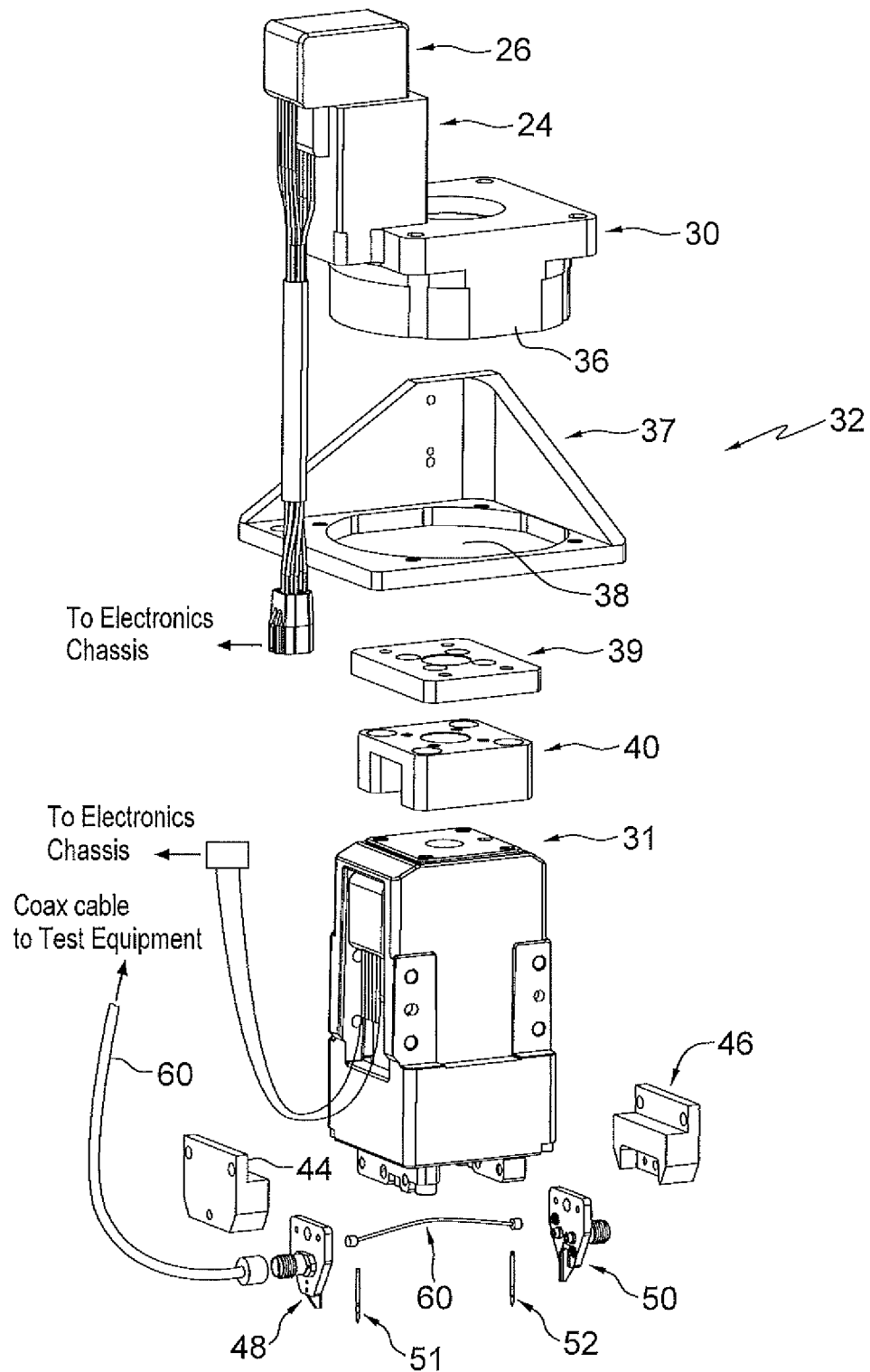
FIG. 3 is an exploded view of a two pin probe portion of the probe assembly shown in FIG. 2.

FIG. 3 shows a two pin probe portion 32 of the probe assembly 15 for rotating and spacing two probes which contact selected pins of the UUT. The two pin probe portion includes a motor 24 with associated drive 29 (FIG. 6) and encoder 26, which in operation controls the rotation of a rotating stage element 30 around the center line of the two pin probe portion. The rotating stage element 30 is mounted on a Z bracket mount 37. A lower part 36 of rotating stage element 30 extends through an opening 38 in the Z bracket mount 31 to a plate adapter 39 for the two pin probe portion. Plate adapter 39 in turn connects to a block spacing module 40, which provides spacing relative to a spacing module 31 of the two pin probe portion 37. Spacing module 31, including a spacing motor 42, and associated driver 45 and encoder 43, which are connected to the motor controller 27 in the test chassis, are shown in the block diagram in FIG. 6.

At the lower end of spacing module 31 are two spaced block printed circuit assembly (PCA) mounts 44 and 46 which are capable of moving linearly toward and away from each other on spacing module 31 under the control of motor 42 and encoder 43, referred to as spacing, shown in FIGS. 1, 2 and 6. Mounted on the block mounts 44 and 46 are circuit assemblies 48 and 50, to which are mounted replaceable probes 51 (main probe) and 52 (secondary probe). Main probe 51 and secondary probe 52 connections to the test equipment 62 are shown in FIG. 1. A ground wire 60 connects circuit assemblies 48 and 50 when the test instrument for the received signals from the UUT is an oscilloscope. In operation, spacing module 31 is rotatable by rotating stage element 30. As indicated above, rotation of the probes is by motor and encoder combination 24,26, while spacing of the probes is controlled by motor arid encoder combination 42,43. The block mounts 44 and 46, the two PCAs 48 and 50 and the two probes 51 and 52 rotate together by action of rotating stage 30, with spacing accomplished independently.

Extending from PCA 48 is coax cable 60 which extends to test equipment 62, when the test equipment is an oscilloscope, which displays the signals obtained by the probes 51, 52 from selected pins of the UUT. Probe 51 is connected to the selected UUT pin, while probe 52 is connected to ground. There is no coax connector from PCA 50 to the test equipment 62 when the test equipment is an oscilloscope. When other test equipment is used, a coax cable for PCA probe 50 is used.

Other test uses include 1) differential measurements, which require a secondary coax cable, with the coax cable connected to an oscilloscope through a differential probe; 2) time domain reflectometer measurements which require a secondary coax cable, connected to a time domain reflectometer; 3) spectrum analyzer measurements with connectors similar to that of an oscilloscope, but using a spectrum analyzer; 4) frequency counter measurements, with connections similar to that for an oscilloscope, but using a frequency counter; and 5) signal generator injections, connections for which are similar to an oscilloscope, but the coax cable connects to a signal generator, for injection of signals into UUT pins.

Figure 4:
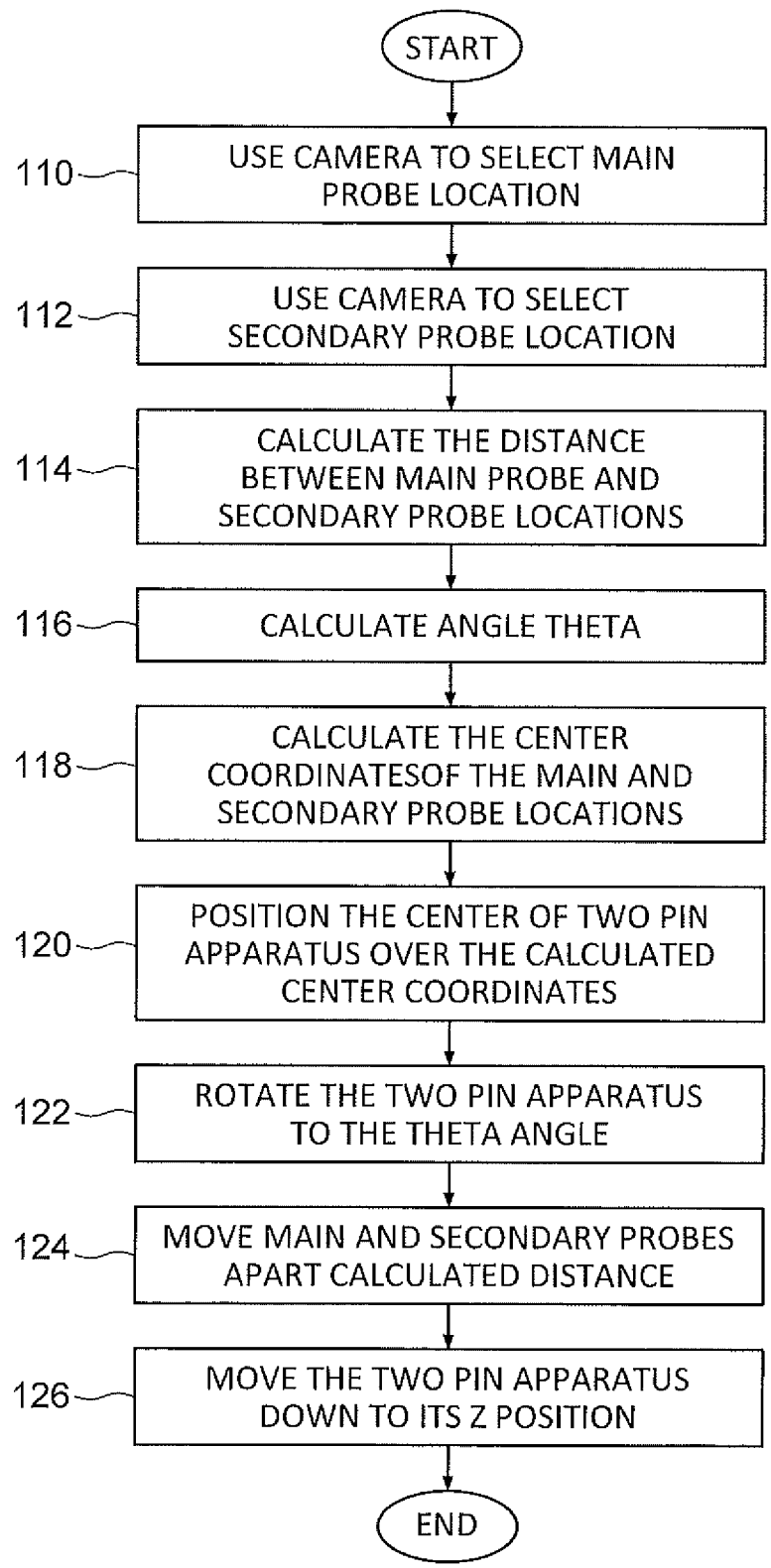
FIG. 4 is a flow chart showing the operation of the probe assembly.
Figure 5A:
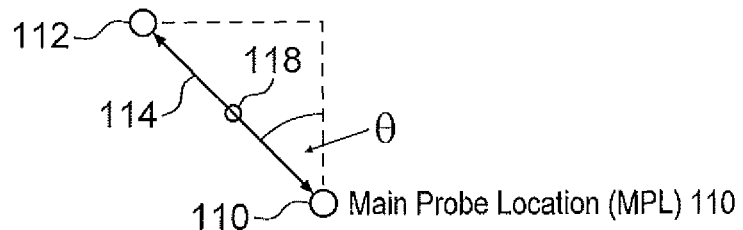
FIG. 5A-5D are diagrams showing the operational steps of the probe assembly.
Figure 5B:
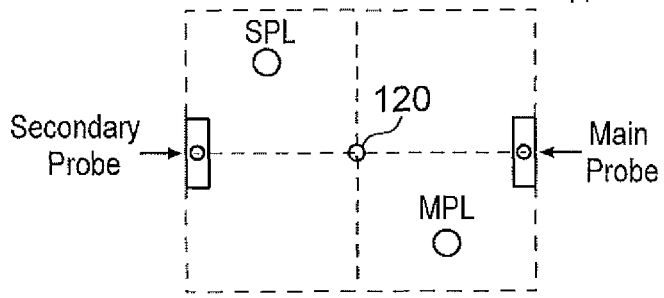
Figure 5C:
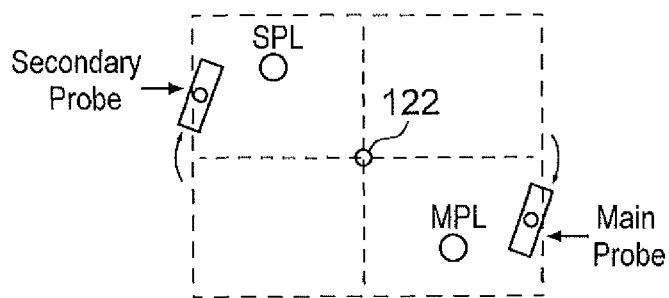
Figure 5D:
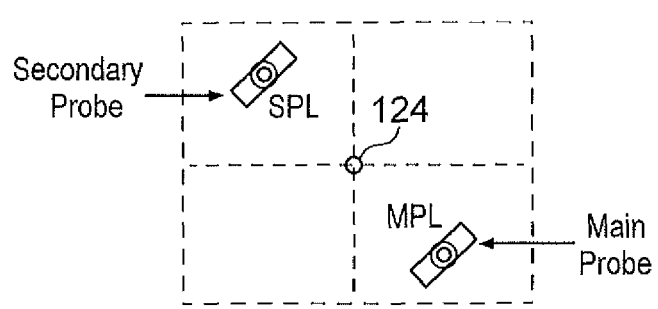

In operation, a UUT, such as a printed circuit board, is clamped in the test apparatus 10. FIG. 4 is a functional flow chart of the probe assembly and FIGS. 5A-5D show the corresponding physical movement of the probe assembly and the two probes. PC 80 first selects the pin on the UUT to test. Referring to FIGS. 2, 4, 5 and 6, camera 70, with light 72, controlled via USB 104, in step 110, shown in FIGS. 4 and 5A, selects the location of main probe 51. In step 112, also shown in FIG. 5A, camera 70 with light 72 selects the location of the secondary probe 52, to ground. In step 114, the distance between the probe locations is calculated, also shown in FIG. 5A. Angle Theta, the angle between the two probes, is then calculated in step 116, also shown in FIG. 5A. The center coordinates of the two probe locations are then calculated in step 118, also shown in FIG. 5A. The center of the two pin probe portion 32 is then positioned over the calculated center coordinates between the two probes, as shown in step 120 and in FIG. 5B. In step 122, shown in FIG. 5C, the spacing module 31 of the two probe assembly is then rotated to the Theta angle. The main and secondary probes are then moved away from each other the calculated distance by the spacing motor, as shown in step 124 and in FIG. 5D. The probe assembly 15 is then moved by motor 23 to its Z position, as indicated in step 126, and signals from the UUT are received.

In one embodiment, using the oscilloscope as the test equipment, signals are received from an operating (running) UUT, while when other test equipment is used, signals can be provided from the probe assembly to the UUT and returning signals received and transmitted to the test instrument. Both operations can be accommodated in one test apparatus.

Accordingly, a two pin prober assembly for use with a high frequency test equipment has been disclosed.

Although a preferred embodiment of the invention has been disclosed for purposes of illustration, it should be understood that various changes, modifications and substitutions may be incorporated in the embodiment without departing from the spirit of the invention, which is defined by the claims which follow.

What is claimed is:

1. A probe assembly for use with a circuit board test apparatus that is capable of holding a unit under test (UUT), comprising:
   a two pin probe portion having two spaced test probe mounting block assemblies;
   first and second test probes mounted respectively in the mounting block assemblies, wherein the probe mounting block assemblies and the first and second test probes are both moveable in a controlled fashion linearly toward and away from each other;
   motor encoder assemblies for moving the probe assembly in the X and Y directions, respectively, relative to the printed circuit board, including rotating the two pin probe portion with the test probes, wherein the motor encoder assemblies include first and second motors operable independently of each other, wherein the first motor rotates the two probes together around a single center line, maintaining the same orientation in the X Y plane during rotation thereof and wherein the second motor moves both of the test probes linearly toward and away from each other;
   a motor encoder assembly for moving the probe assembly in the Z direction relative to the printed circuit board;
   a camera for selecting first and second pin locations on the UUT, for the test probes;
   a control assembly for calculating the distance between the selected first and second pin locations and for controlling the movement of the first and second test probes to the selected pin locations on the UUT;
   wherein signals from the pin locations on the UUT are received by the test probes in contact therewith; and
   a connection line for transmitting received signals from the selected pins to a test instrument for display of the received signals.

2. The probe assembly of claim 1, wherein the display instrument to which the received signals are transmitted is a high frequency measurement system.

3. The probe assembly of claim 2, wherein the display instrument is an oscilloscope and wherein the probe assembly includes a ground connection between the mounting block assemblies.

4. The probe assembly of claim 1, wherein the mounting block assemblies include a main probe mount assembly and a secondary mount assembly, and where the probe assembly includes a cable between the main mounting block assembly and the test instrument.

5. The probe assembly of claim 1, wherein the motor encoder for the probe assembly in the Z direction includes a linear actuator operated by a motor.

6. The probe assembly of claim 1, wherein the two pin probe portion includes a rotating element, which in turn is mounted to a support bracket, wherein a lower portion of the rotating element extends therethrough and is connected to a plate adaptor which in turn is connected to a spacing module, on which is mounted the mounting block assemblies holding the first and second test probes, wherein in operation, the spacing module is rotatable, rotating the test probes together.

* * * * *